(12) United States Patent
Omi et al.

(10) Patent No.: US 6,969,885 B2
(45) Date of Patent: Nov. 29, 2005

(54) NON-VOLATILE SEMICONDUCTOR MEMORY DEVICE WITH FIRST AND SECOND NITRIDE INSULATORS

(75) Inventors: Tadahiro Omi, 2-1-17-301, Komegafukuro, Aoba-ku, Sendai-shi, Miyagi (JP) 980-0813; Naoki Ueda, Nara (JP)

(73) Assignees: Tadahiro Omi, Miyagi (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/732,475

(22) Filed: Dec. 11, 2003

(65) Prior Publication Data

US 2004/0119111 A1 Jun. 24, 2004

(30) Foreign Application Priority Data

Dec. 12, 2002 (JP) .............................. 2002-360872

(51) Int. Cl.[7] .................... H01L 29/792; H01L 29/788

(52) U.S. Cl. .................. 257/324; 257/315; 257/316

(58) Field of Search ................................ 257/315–326; 438/201, 211, 216, 241, 257, 258, 260–264, 438/266, 591, 593, 594

(56) References Cited

FOREIGN PATENT DOCUMENTS

JP          2001-160555          6/2001

*Primary Examiner*—Hung Vu
(74) *Attorney, Agent, or Firm*—Nixon & Vanderhye P.C.

(57) ABSTRACT

A non-volatile semiconductor memory device comprising at least: a first electrode containing silicon atoms; and a second electrode formed on the first electrode through an insulating film, wherein the insulating film is formed of at least two layers of: a lower silicon nitride film on the first electrode side obtained by nitriding the first electrode; and an upper silicon nitride film formed on the lower silicon nitride film according to a chemical vapor deposition method, and at least a part of the lower silicon nitride film contains a rare gas element at an area density of $10^{10}$ cm$^{-2}$ or more.

8 Claims, 8 Drawing Sheets

NON-VOLATILE SEMICONDUCTOR MEMORY DEVICE WITH FIRST AND SECOND NITRIDE INSULATORS

CROSS-REFERENCE TO RELATED APPLICATION

This application is related to Japanese application No. 2002-360872 filed on Dec. 12, 2002, whose priority is claimed under 35 USC §119, the disclosure of which is incorporated by reference in its entirety.

BACKGROUND OF THE INVENTION

1. Field of the Invention

The present invention relates to a non-volatile semiconductor memory device and a manufacturing method for the same. More specifically, the present invention relates to a non-volatile semiconductor memory device in which data can be electrically rewritten, and a manufacturing method for the same.

2. Description of the Related Art

A flash memory that represents a non-volatile semiconductor memory device in which data can be electrically rewritten will be described below. A flash memory has: a first insulating film 2; a first polysilicon electrode 3 that becomes a floating gate; a second insulating layer 4 formed of a lamination made of an oxide film, a nitride film and another oxide film; and a second polysilicon electrode 5 that becomes a control gate which are laminated on a semiconductor substrate 1 in this order shown in FIG. 5.

Figure 5:
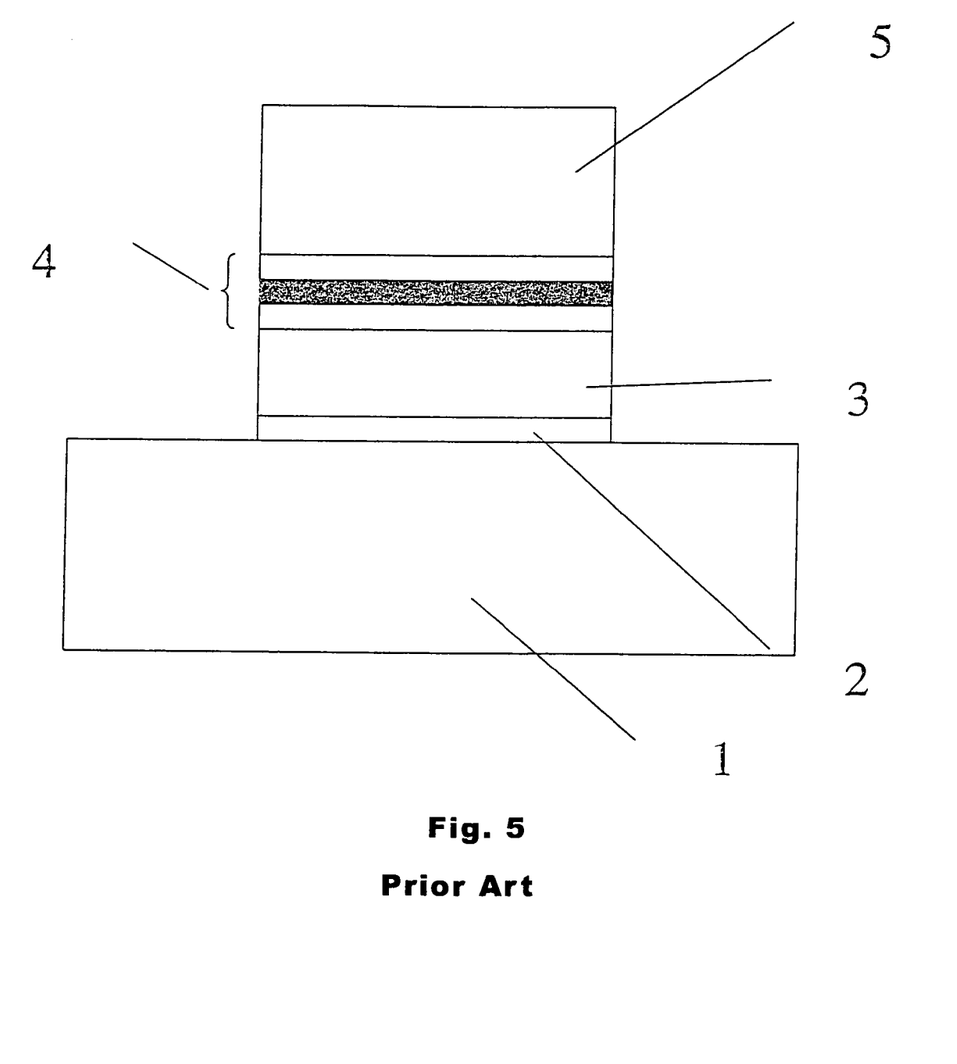
FIG. 5 is schematic cross-sectional view of a flash memory cell of the prior art.

This flash memory allows for rewriting of data through release and injection of electrons via the first insulating film 2 by utilizing the tunnel phenomenon; therefore, the first insulating film 2 is also referred to as a tunnel insulating film. The first insulating film 2 usually has a film thickness of approximately 8 to 20 nm. In addition, it is difficult to form a high quality insulating film that doesn't cause much leak current on polysilicon.

Therefore, the second insulating layer 4 is made of a lamination of, for example, a polysilicon oxide film, a CVD silicon nitride film and a CVD silicon oxide film so as to secure relaxation of the electrical field and capacity coupling between the control gate and the floating gate. The upper and lower oxide films serve as barrier layers against charge injections from the gate. The intermediate nitride film has a relative dielectric constant higher than that of the oxide films, thereby the second insulating layer 4 can secure a physical film thickness. Furthermore, the electrical field in the insulating film can be relaxed while securing the same capacitance as in the case of a single layer of an oxide film, thereby a leak current can be reduced in comparison with the case of a single layer of an oxide film.

Figure 6:
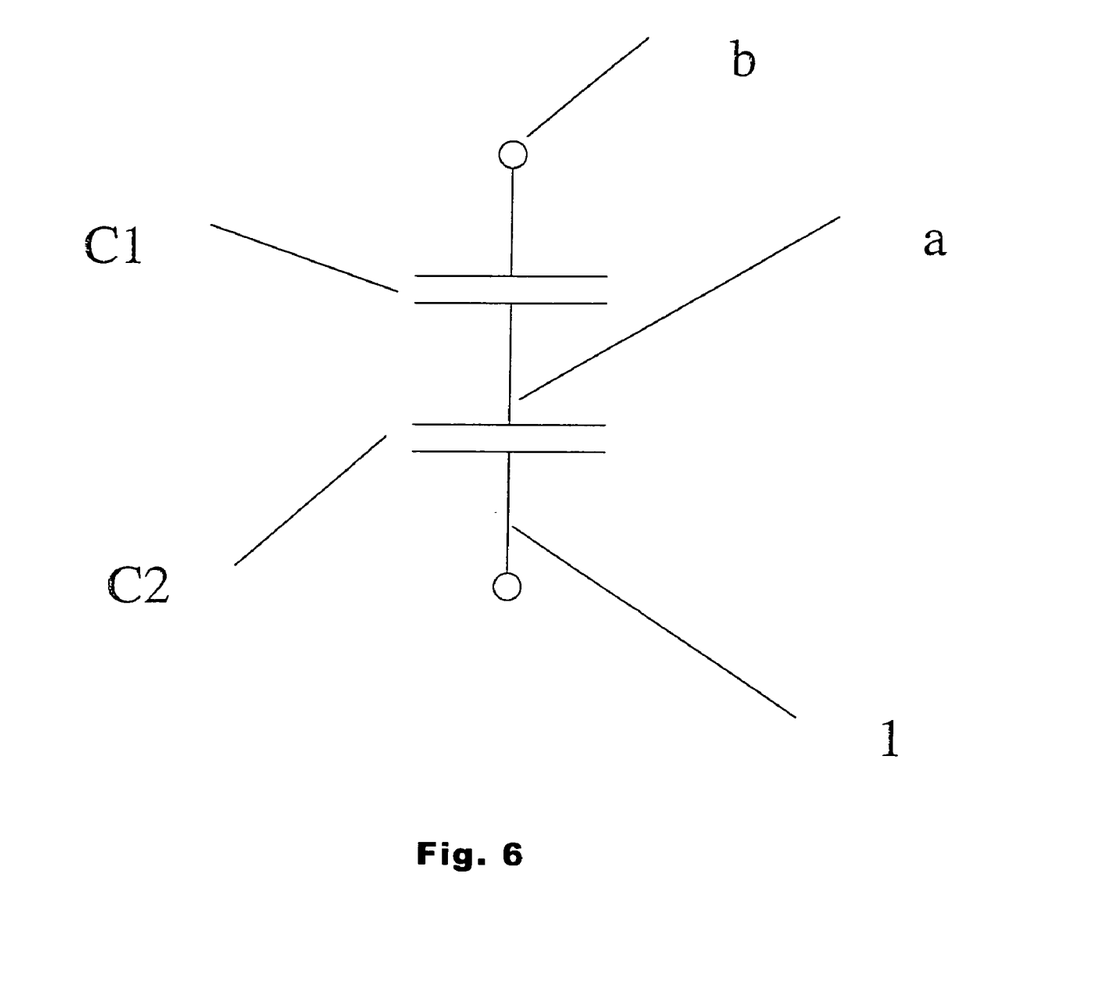
FIG. 6 is a simplified equivalent circuit diagram of a non-volatile semiconductor memory device having a floating gate.

In a non-volatile semiconductor memory device having a floating gate, the potential of the floating gate electrode is controlled through the capacity coupling between the floating gate electrode and the control gate electrode by controlling the potential of the control gate. FIG. 6 shows a simplified equivalent circuit diagram of a non-volatile semiconductor memory device having a floating gate. Herein, a potential Vfg of a floating gate "a" is represented as follows in the case where a semiconductor substrate 1 is grounded:

$$Vfg = C1/(C1+C2) \times Vcg - Qfg/(C1+C2) \quad (1)$$

wherein C1 denotes a capacity between the floating gate "a" and a control gate "b", C2 denotes a capacity between the floating gate "a" and the semiconductor substrate 1, and Vcg denotes a control gate voltage.

That is, the floating gate voltage is controlled by the control gate voltage. The second term in the above expression representing the potential of the floating gate "a" changes creating a difference of the readout current in accordance with the amount of charge accumulated within the floating gate "a". This difference is detected by a readout circuit so as to determine the memory condition of the memory cell. As for rewriting of data, a high voltage is generated between the semiconductor substrate 1 and the floating gate "a" via the control gate "b" so that electrons are tunneled through this portion of insulating film, thereby a release or an injection of electrons is carried out.

In addition, Japanese Unexamined Patent Publication No. 2001-160555 discloses a non-volatile semiconductor memory device having the same structure as the above, except that a nitride film formed of radical nitriding species is utilized for the second insulating film.

C1/(C1+C2) in the above expression (1) is referred to as a gate coupling ratio. The control gate voltage that is required to obtain a constant floating gate voltage required for the rewriting operation is in the relationship of inverse proportion with this gate coupling ratio.

A high voltage is necessary as the rewriting voltage in the above-described non-volatile semiconductor memory device according to the conventional art. This is because a sufficient voltage that can provide energy exceeding the band gap of this film to electrons is necessary to be applied to the control gate at the time when electrons are injected through the first insulating film (tunnel insulating film) 2, and the voltage applied to the first insulating film is based on the above-described gate coupling ratio, making it necessary for a greater voltage to be applied between the semiconductor substrate and control gate.

It is necessary to apply a high voltage to the control gate in the case where the capacitance between the above-described floating gate and the control gate is small, leading to the reduction of the gate coupling ratio. It is effective to increase the capacitance value between the floating gate and the control gate in order to increase this gate coupling ratio. In order to achieve this, there are two methods: a method for increasing the areas of the capacitor portion between the above-described floating gate and the control gate; and a method for reducing the thickness of the insulating film in this capacitance portion.

According to the former method, the dimensions of the device are increased. Therefore, the latter method is more advantageous in forming a device of a large capacitance. A lamination of oxide film/nitride film/oxide film is adopted in the conventional art as described above. The upper and lower oxide films are, for example, a thermal oxide film on polysilicon and an oxide film formed by means of a CVD, respectively. The insulating characteristics of the gate insulating film of a MOSFET formed on a silicon substrate are greatly inferior to those of a thermal oxide film formed on silicon single crystal (second electrode) having a plane direction of (100). Furthermore, electrons (leak current) flow through the lower layer oxide film in the first insulating film due to the concentration of electrical field in portions forming corners of the first silicon electrode and in the vicinity of grain borders of polysilicon in the case where the oxide film is reduced in the thickness. These electrons are trapped in the intermediate layer comprised nitride film that has been made according to a CVD under low pressure. The trapped electrons intensify the electrical field in the lower layer oxide film; therefore, a leak current cause through this portion even under the condition of low electrical field bias. A similar phenomenon is caused to the second polysilicon electrode and the upper oxide film thereon. In addition, the insulating characteristics of the intermediate layer comprised nitride film are deteriorated to the performance level corresponding to that of the single layer polysilicon oxide film in the case where the nitride film is reduced in the thickness, leading to the failure in relaxing the electrical field through out the entire complex insulating film.

As described above, the performance of blocking the leak current in the second insulating film is suppressed to a low level in the case where the second insulating film is reduced in the thickness according to a conventional method in order to reduce the rewriting voltage, and it becomes difficult to carry out the rewriting operation of the flash memory and to properly hold charge. As a result, the gate coupling ratio can not be increased; therefore, the reduction in the operation voltage is difficult.

Furthermore, the oxide film formed on the top surface of the polysilicon electrode according to the conventional art is a thermal oxide film formed at a temperature of 800° C. or more. This heat treatment at a temperature of 800° C. or more makes the grains grow in the base polysilicon electrode. Such growth of the grains increases the unevenness on the surface of the polysilicon electrode, resulting in a great loss of flatness on the surface on which an insulating film is to be formed. Therefore, the insulating performance tends to be lost due to the concentration of the electrical field caused by microscopic unevenness of the capacitor.

In addition, the tighter the bond of Si—N in the nitride film formed of radical nitriding species is, the higher the barrier property of the nitride film itself against nitriding species in the second insulating layer formed of radical nitriding species described in Japanese Unexamined Patent Publication No. 2001-160555. Therefore, the diffusion of the nitriding species is blocked and the growth rate of this nitride film tends to be saturated, making it difficult to obtain an arbitrary thickness.

SUMMARY OF THE INVENTION

The present invention provides a non-volatile semiconductor memory device comprising at least: a first electrode containing silicon atoms; and a second electrode formed on the first electrode through an insulating film, wherein the insulating film is formed of at least two layers of: a lower silicon nitride film on the first electrode side obtained by nitriding the first electrode; and an upper silicon nitride film formed on the lower silicon nitride film according to a chemical vapor deposition method, and at least a part of the lower silicon nitride film contains a rare gas element at an area density of $10^{10}$ cm$^{-2}$ or more.

The present invention also provides a manufacturing method for a non-volatile semiconductor memory device comprising at least: a first electrode containing silicon atoms; and a second electrode formed on the first electrode through an insulating film, wherein the insulating film is formed of at least two layers of: a lower silicon nitride film containing a rare gas element at an area density of $10^{10}$ cm$^{-2}$ or more in at least a part thereof, and an upper silicon nitride film; the lower silicon nitride film is formed by nitriding the first electrode in an atmosphere that includes nitrogen gas or a nitrogen atom-containing compound gas and a rare gas into which microwaves are introduced; and the upper silicon nitride film is formed according to a chemical vapor deposition method.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

A non-volatile semiconductor memory device of the present invention comprises at least: a first electrode containing silicon atoms; and a second electrode formed on the first electrode through an insulating film. The first electrode is not particularly limited as long as it contains silicon atoms, and an example thereof includes a polysilicon layer. On the other hand, examples of the second electrode include metal layers such as of aluminum and copper, a polysilicon layer, silicide layers of high melting point metals (titanium, tungsten and the like), and laminations thereof.

In addition, the first electrode is usually formed on the semiconductor substrate with an insulating film interposed therebetween. The semiconductor substrate is not particularly limited, and examples thereof include silicon based semiconductor substrates such as a silicon substrate and a silicon germanium substrate. Examples of the insulating film include a silicon oxide film, a silicon nitride film, laminations thereof and the like.

In addition, the first electrode may be formed according to a method wherein: a trench is formed in a semiconductor substrate; an insulating film is formed on the surface of the trench; a first electrode material is filled into the trench; and a layer made of the electrode material is flattened by means of a chemical mechanical polishing method.

According to the present invention, the insulating film between the first and second electrodes is formed of at least two layers of: a lower silicon nitride film on the first electrode side obtained by nitriding the first electrode; and an upper silicon nitride film formed on this lower silicon nitride film according to a chemical vapor deposition method.

Furthermore, at least a part of the lower silicon nitride film contains a rare gas element at an area density of $10^{10}$ cm$^{-2}$ or more. In addition, the rare gas element may be included in at least a part of the lower silicon nitride film or may be included in the entire surface of the lower silicon nitride film. Herein, it is preferable for the rare gas element to be Kr or Ar from the point of view of the efficiency of generating radicals that contribute to oxynitridation. In the case where the area density of rare gas element is less than $10^{10}$ cm$^{-2}$, the stoichiometric composition of the silicon nitride film is far away from the ideal, so that the generation rate of the silicon nitride film is greatly reduced and this is not preferable because a desired performance cannot be exercised. Preferable area density is $10^{10}$ cm$^{-2}$ or more. It is noted that the area density is measured by a secondary ion mass spectrometer (SIMS) and can be set at a predetermined value by adjusting manufacturing conditions such as a flow amount of the rare gas, DC bias, RF power and degree of vacuum.

An example of the method for forming a lower silicon nitride film that includes a rare gas element includes a method for nitriding silicon atoms included in the first electrode in an atmosphere that includes nitrogen gas or a nitrogen atom-containing compound gas and a rare gas. In particular, it is preferable to carry out nitridation while exciting plasma in the atmospheric gas by means of microwaves.

The method for exciting plasma by means of microwaves is not particularly limited as long as microwaves can be introduced into the process chamber, and a conventional method can be utilized. For example, a plasma unit using a radial line slot antenna can be utilized.

Herein, an example of the nitrogen atom-containing compound gas includes $NH_3$. In addition, $H_2$ may be included in the atmosphere.

It is preferable for the flow ratio of the respective gases in the atmosphere to be 90 to 99.9%/0.1 to 10% (Kr/NH$_3$) in the case where the rare gas is Kr and the nitrogen atom-containing compound gas is $NH_3$.

It is preferable for the frequency of the microwaves which are used to be in a range between 900 MHz or more and 10 GHz or less.

In particular, it is preferable to form the lower silicon nitride film by using a high density plasma excited by microwaves when the temperature of the substrate is as low as 550° C. or less (e.g., 200 to 550° C.). That is, a thin silicon nitride film having leak current-proof characteristics equal to or superior to those of the silicon oxide film formed on a single crystal Si having the plane direction of (100) at a high temperature of approximately 1000° C. and having charge-to-breakdown characteristics superior to those of the silicon oxide film formed on a single crystal Si having the plane direction of (100) at a high temperature of approximately 1000° C. can be formed on the first electrode at a temperature as low as 550° C. or less (e.g., 400 to 500° C.) by directly nitriding silicon with hydrogen nitride NH* in atom form (also referred to as NH radical), nitrogen N* in atom form (also referred to as N radical) or a mixed nitriding species of $N_2$+ radicals and hydrogen H* in atom form (also referred to as H radical). As a result of this, the capacitance between the polysilicon electrodes can be increased while keeping the leak current at a low level in the condition where the grain growth in the polysilicon is suppressed sufficiently low at a low temperature. Therefore, the gate coupling ratio can be increased, leading to a great reduction of the voltage to be applied at the time of the rewriting operation without damaging the reliability of the flash memory.

It is also possible to change the nitrogen concentration peak in the insulating film in the depth direction by changing the flow ratio of the nitrogen gas or the nitrogen atom-containing compound gas during the formation of the insulating film.

Furthermore, it is preferable for the lower silicon nitride film to be exposed to hydrogen nitride NH* in atom form or nitrogen N* in atom form and hydrogen H* in atom form that have been formed by exciting plasma by means of microwaves in an atmosphere that includes nitrogen gas or a nitrogen atom-containing compound gas and a rare gas after the formation of the lower silicon nitride film. As a result, it becomes possible to form a high quality silicon nitride film at a low temperature.

The same gases that have been utilized for the formation of the above-described lower silicon nitride film can be utilized as the nitrogen gas or the nitrogen atom-containing compound gas and the rare gas in the above-described process. It is preferable for the frequency of the microwaves that are used to be in a range between 900 MHz or more and 10 GHz or less. Furthermore, it is preferable to carry out the above-described process when the temperature of the substrate is as low as 550° C. or less (e.g., 200 to 550° C.).

Furthermore, the above-described treatment is more suitable in the case where the non-volatile semiconductor memory device is provided with a peripheral circuit that includes MOSFETs. That is, the gate insulating film forming the MOSFETs is exposed to hydrogen nitride NH* in atom form or nitride N* in atom form and hydrogen H* in atom form at the same time as the lower silicon nitride film, thereby the peak of the nitrogen atom density can be generated in the insulating film while carrying out an exposure treatment of the lower silicon nitride film. As a result, the barrier property against impurities in the insulating film can be increased and the height of the barrier against the current and withstand insulation breakage performance can be increased.

It is noted that the structure of the MOSFETs is not particularly limited as long as they have a gate insulating film and a well-known structure can be adopted.

Furthermore, in the case where the gate insulating film forming the MOSFETs is made of a silicon nitride film, it is possible to form the silicon nitride film by exposing an active region of a MOSFET to a hydrogen nitride NH* in atom form or nitrogen N* in atom form and hydrogen H* in atom form.

In addition, in the case where the non-volatile semiconductor memory device has a final passivation layer as the top layer, it is preferable to expose the lower and upper silicon nitride films to a hydrogen radical atmosphere at a temperature of 500° C. or less (concretely, 300 to 500° C.) before the formation of the final preservation layer. This treatment can make the composition and the electrical characteristics of the upper silicon nitride film that has been formed through a chemical vapor reaction close to those of an ideal silicon nitride film. In addition, this treatment can prevent the deterioration of the characteristics of the silicon nitride film due to a high temperature treatment by compensating hydrogen that has been separated from the lower and upper silicon nitride film and from the interface between the lower silicon nitride film and the silicon substrate.

As described above, the insulating film has a two layered structure obtained by directly nitriding the first electrode made of polysilicon with species (NH or N radicals) containing nitrogen in atom form and by forming a silicon nitride film through a chemical vapor reaction, thereby it becomes possible to implement a broad range of film thickness that can be applied and to achieve excellent interface characteristics and a short processing time for the formation of the film.

Furthermore, the atmosphere that includes H radicals is made to contain N radicals or $N_2+$ radicals, or NH radicals, so that such annealing is made to effect the active regions of the MOSFET elements in the peripheral circuit in addition to the memory cells, thereby nitridation is carried out on the oxide film for the already prepared gate oxide film, and an extremely thin nitride film with high performance and high reliability can be simultaneously formed on the silicon substrate through direct nitridation of silicon.

According to the conventional art, a silicon oxide film is combined to a silicon nitride film, thereby the height of the barrier against charge injection is secured. Contrarily, according to the present invention, it becomes possible to form an insulating film solely of silicon nitride film without combining a silicon oxide film which is disadvantageous for securing the electrical capacitance due to its dielectric constant being approximately ½ of that of the silicon nitride film. As a result, the electrical capacitance can be greatly increased in comparison with the conventional art and the operation voltage for the non-volatile semiconductor memory device can be greatly reduced.

Accordingly, reduction in the operation voltage in the above-described non-volatile semiconductor memory device as well as an enhancement of the reliability of the gate insulating film of and an enhancement of the performance of the devices in the peripheral circuit can be simultaneously achieved.

Embodiment 1

Figure 1:
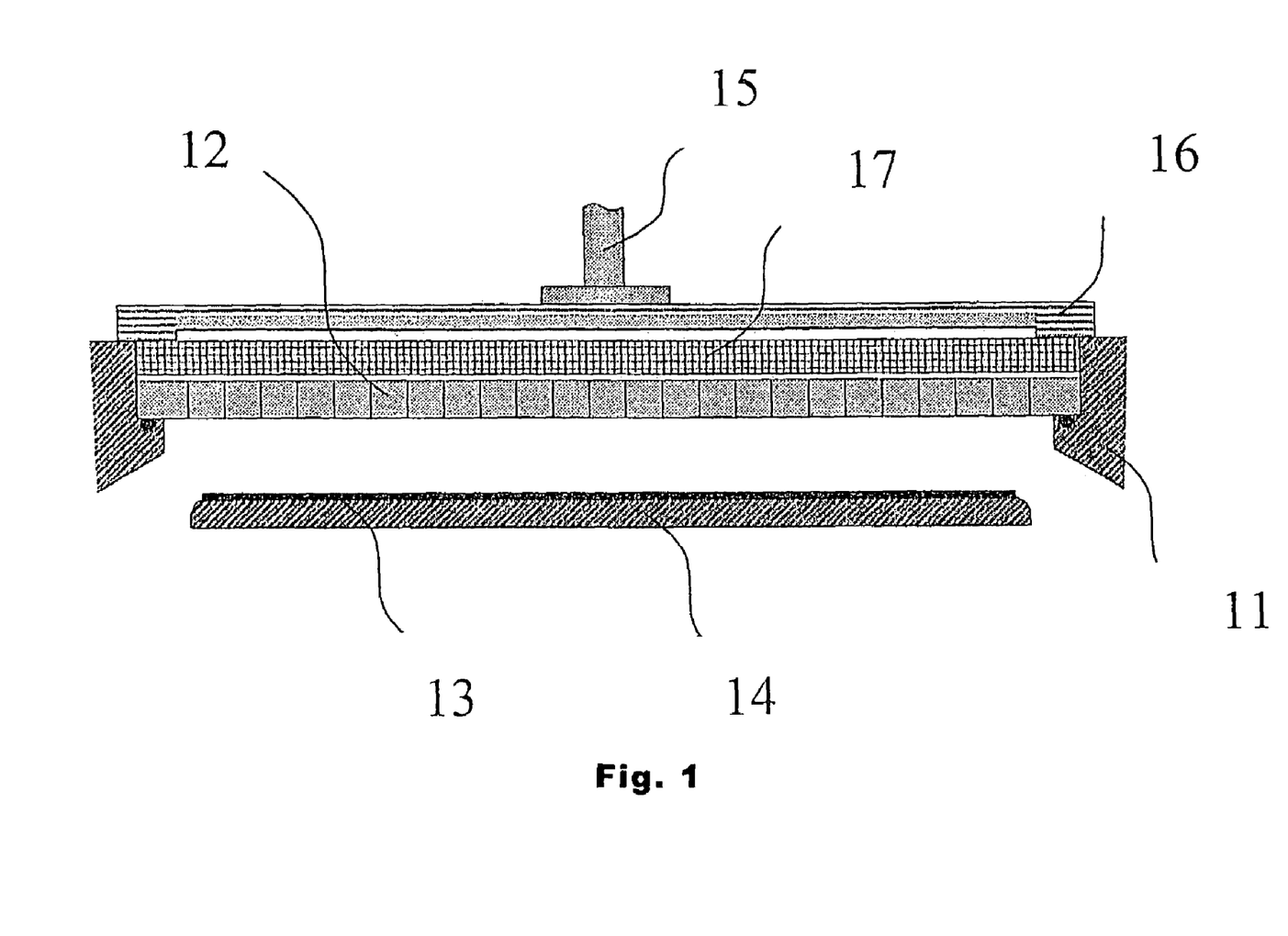
FIG. 1 is a schematic view of a plasma unit using a radial line slot antenna.

First, formation of a lower silicon nitride film using plasma at a low temperature will be described. FIG. 1 is a schematic cross sectional view showing one example of a unit using a radial line slot antenna in order to implement a nitriding method of the present invention.

In the present embodiment, Kr is utilized as a rare gas for the formation of a nitride film. A vacuum container (process chamber) 11 is vacuumed and Kr gas and $NH_3$ gas are introduced from a shower plate 12 into the process chamber within which pressure is set at approximately 1 Torr. A substrate 13 in a disk form such as a silicon wafer is placed on a sample support 14 which has a heating mechanism, and the temperature of the sample is set at approximately 400° C.

2.45 GHz microwaves are transmitted into the process chamber 11 from a coaxial waveguide 15 through a radial line slot antenna 16 and a dielectric plate 17, so that high density plasma is generated in the process chamber 11. The distance between the shower plate 12 and the substrate 13 is set at 60 mm in the present embodiment. The smaller this distance is, the higher the speed of the film formation becomes possible. The silicon nitride film formed under the above-described conditions includes Kr at an area density of $10^{10}$ $cm^{-2}$ or more.

As described above, the inclusion of Kr at an area density of $10^{10}$ $cm^{-2}$ or more contributes to the improvement of electrical characteristics and the reliability of silicon nitride film. Concretely, the silicon nitride film is considered to be improved because of the following reasons.

First, NH radicals are efficiently generated due to Kr radicals in the intermediate excited condition in the high density plasma excited in a mixed gas of Kr and $NH_3$. Such NH radicals nitride the surface of the substrate. It becomes possible according to the present embodiment to form a high quality silicon nitride film on any of the surfaces in a (100) plane, in a (111) plane and in a (110) plane at a low temperature irrelevant of the plane direction of silicon.

Existence of hydrogen radicals in the plasma is one important factor for the formation of a silicon nitride film according to the present invention. The existence of hydrogen radicals in the plasma allows dangling bonds on the silicon nitride film and in the interface to be terminated by forming Si—H and N—H bonds and, as a result, electron traps on the silicon nitride film and in the interface are eliminated. The existence of the Si—H bond and N—H bond in the silicon nitride film of the present invention is confirmed through the measurement of infrared absorption spectrum and X-ray photoelectron spectrum, respectively. The existence of hydrogen eliminates the hysteresis in the CV characteristics. In addition, the density in the interface between the silicon film and the silicon nitride film can be maintained at a level as low as $3 \times 10^{10}$ $cm^{-1}$ in the case where the temperature of the substrate is 500° C. or more.

In the case where a silicon nitride film is formed by utilizing a mixture gas of Kr and $N_2/H_2$, the traps for electrons and positive holes in the film can be drastically reduced by setting the partial pressure of the hydrogen gas at 0.5% or more. This effect can be achieved as a result of formation of Si—H bond and N—H bond in the insulating film and inclusion of Kr. In addition, stress is relieved in the nitride film and in the interface between the silicon film and the nitride film, and fixed charge and the interface level density in the silicon nitride film are reduced, so that the electrical characteristics and the reliability are greatly improved.

Embodiment 2

Figure 2:
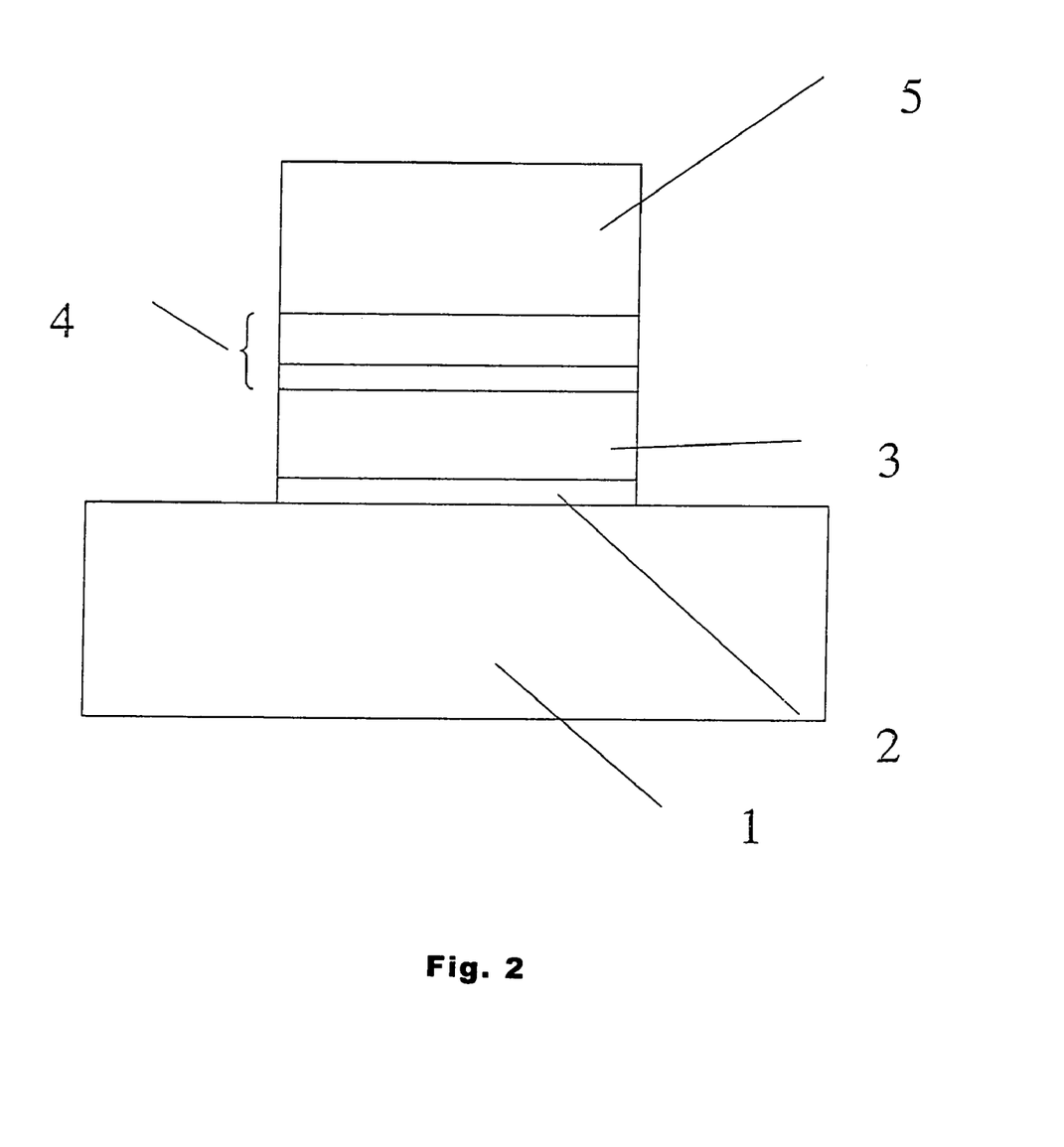
FIG. 2 is schematic cross-sectional view of a flash memory cell of a first embodiment of the present invention.

FIG. 2 shows a structure that the present invention is applied to a flash memory. FIG. 2 shows an electrically rewritable flash memory having: a first insulating film 2; a first polysilicon electrode 3 that becomes a floating gate; a second insulating layer 4 made of two layers of silicon nitride films; and a second polysilicon electrode 5 that becomes a control gate which are laminated on a semiconductor substrate 1 in this order.

A manufacturing process of the flash memory shown in FIG. 2 is illustrated with reference to schematic cross sectional views of FIGS. 3A to 3I. The cross sectional views separately show a flash memory cell channel region A, a peripheral circuit high withstand voltage MOSFET element region B and a low voltage high performance MOSFET element region C.

Figure 3A:
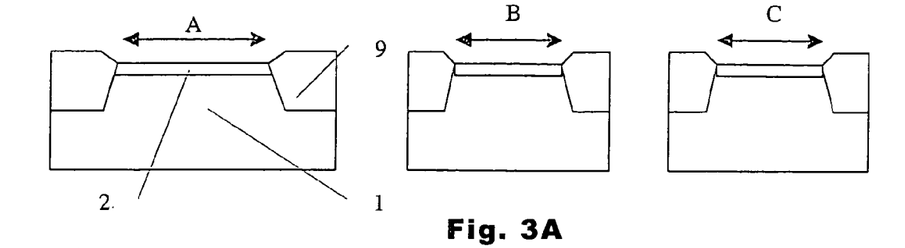
FIGS. 3A to 3I are schematic cross-sectional views showing steps for manufacturing the flash memory cell of the first embodiment semiconductor devices of the present invention.

First, a well and an element isolation region 9 are formed on the semiconductor substrate 1. Then, the insulating film 2 that becomes a tunnel oxide film of the flash memory is formed, after the removal of the insulating film on the active region, so as to have a film thickness of approximately 10 nm (FIG. 3A).

Figure 3B:
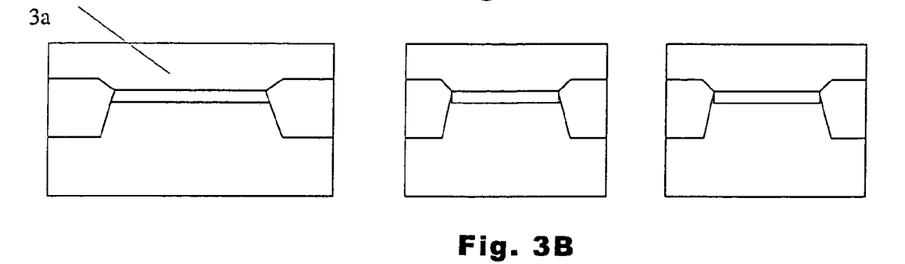

Next, a polysilicon layer 3a is deposited so as to have a thickness of approximately 100 nm as the first electrode that becomes the floating gate (FIG. 3B).

Figure 3C:
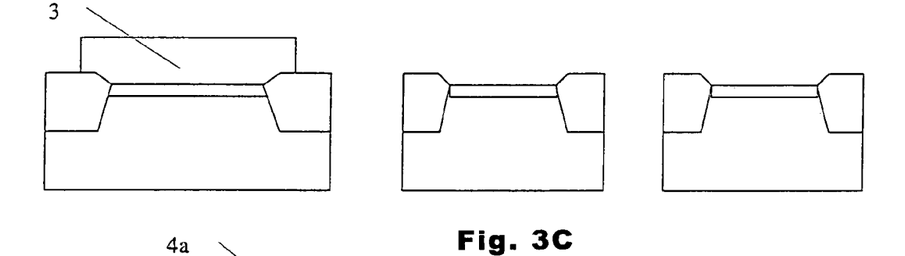

The region of the floating gate is defined according to the lithography and, furthermore, the polysilicon layer 3a is etched by means of dry etching, thereby the first polysilicon electrode 3 is formed (FIG. 3C).

Figure 3D:
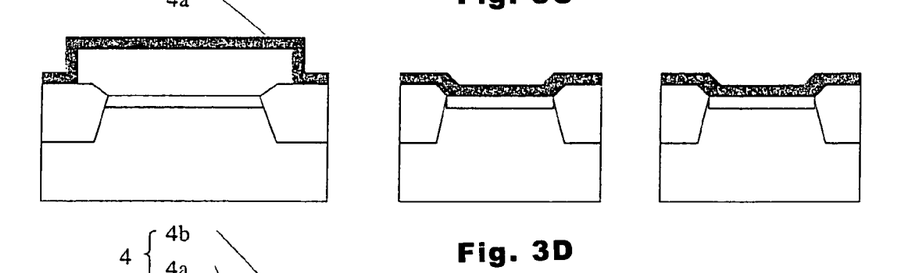

Next, a lower silicon nitride film 4a is formed on the first polysilicon electrode 3 as a portion of the second insulating layer 4 formed of two layers of the lower silicon nitride film 4a and the upper silicon nitride film 4b (FIG. 3D).

This lower silicon nitride film 4a is formed as follows. The vacuum container (process chamber) is vacuumed, and Kr gas, $N_2$ gas and $H_2$ gas are introduced from the shower plate into the process chamber wherein the pressure is set at approximately 100 mTorr and the temperature of the semiconductor substrate 1 is set at 500° C. Then, 2.45 GHz microwaves are transmitted into the process chamber through a radial line slot antenna and a dielectric plate from a coaxial waveguide and a high density plasma is generated in the process chamber, thereby the lower silicon nitride film 4a is formed on the surface of the first polysilicon electrode 3 so as to have a thickness of 2 to 4 nm. This lower silicon nitride film 4a includes Kr at an area density of $10^{10}$ cm$^{-2}$ or more.

Figure 3E:
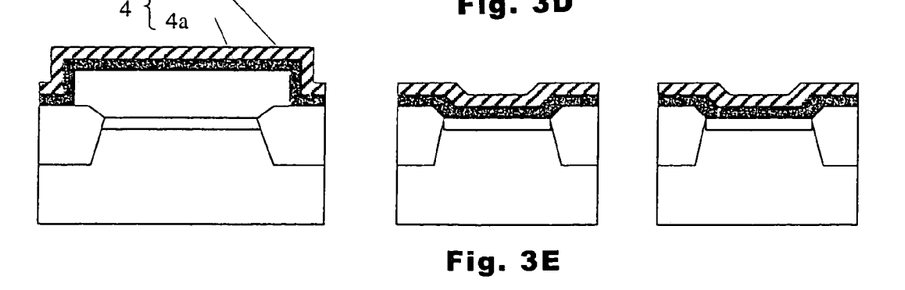

Next, the upper silicon nitride film 4b formed on the lower silicon nitride film 4a is formed as follows (FIG. 3E). The inside of the process chamber is set at a pressure as low as 1 Torr or less, and the semiconductor substrate 1 is heated to 700 to 800° C. and then, SiClH$_2$ gas and NH$_3$ gas are introduced. These gasses make a reaction, so that the upper silicon nitride film 4b made of Si$_3$N$_4$ is deposited on the lower silicon nitride film 4a which is the first layer so as to have a thickness of approximately 5 to 20 nm. This is an example of a method for depositing Si$_3$N$_4$ in order to form the second layer by means of a chemical vapor reaction, and any reaction for depositing Si$_3$N$_4$ resulting from a reaction of a reduction gas of Si and a nitrogen based gas may of course be used for the present embodiment.

Figure 3F:
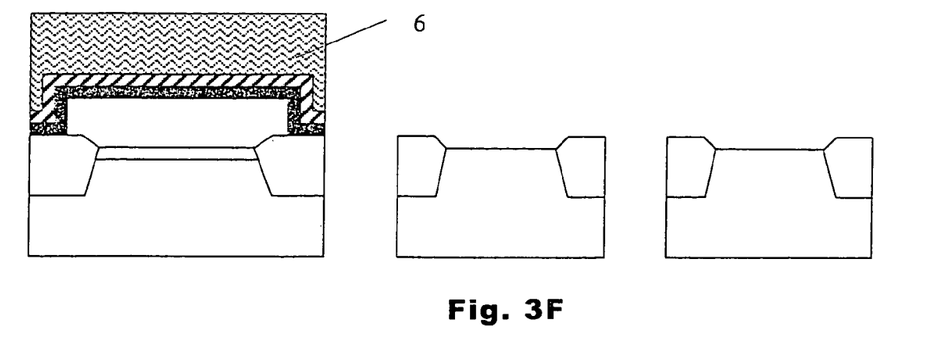

After that, a photoresist layer 6 is placed on the memory cell array by means of lithography while an opening is provided on the photoresist layer 6 above the peripheral circuit, thereby the above-described nitride film and oxide film are removed from the peripheral circuit portion as well as impurity ion implantation for adjusting the threshold value of the MOSFET elements in the peripheral circuit is carried out (FIG. 3F).

Figure 3G:
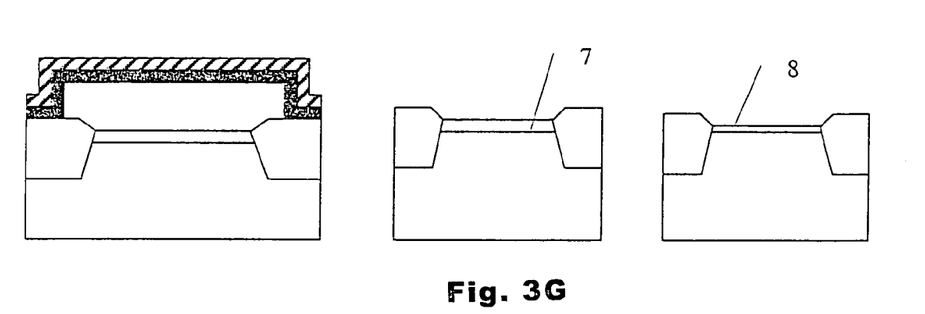

After the removal of the photoresist layer 6, the eternity of the substrate is exposed to an oxidizing atmosphere, thereby a gate oxide film 7 for the MOSFET elements is formed on active regions for the MOSFETs in the peripheral circuit. In addition, the gate oxide films 7 and 8 are formed in the peripheral circuit high withstanding voltage MOSFET element region B and the low voltage high performance MOSFET element region C so as to have thickness of 16 nm and 3 nm, respectively (FIG. 3G).

After that, the entirety of the substrate is again exposed to a radical nitriding atmosphere in the same manner as described above (FIG. 3H). That is, the vacuum container (process chamber) is vacuumed, and Kr gas, N$_2$ gas and H$_2$ gas are introduced from a shower plate into the process chamber wherein the pressure is set at approximately 100 mTorr and the temperature of semiconductor substrate 1 is set at 500° C. Then, 2.45 GHz microwaves are transmitted into the process chamber through a radial line slot antenna and a dielectric plate from a coaxial waveguide, so that a high density plasma is generated in the process chamber where the semiconductor substrate 1 is exposed to this atmosphere. It is noted that this process may be replaced with a process for exposing the semiconductor substrate to a hydrogen radical atmosphere at 300 to 500° C.

Figure 3H:
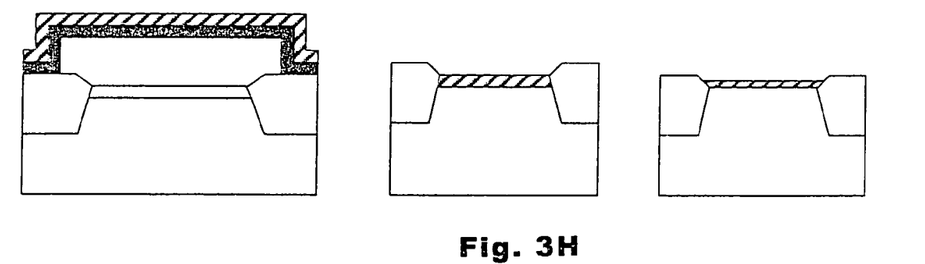

This process carries out an improvement in the film quality of the silicon nitride film on the memory cells and an improvement in the film quality of the gate oxide films (7 and 8) in the peripheral circuit, simultaneously.

Figure 3I:
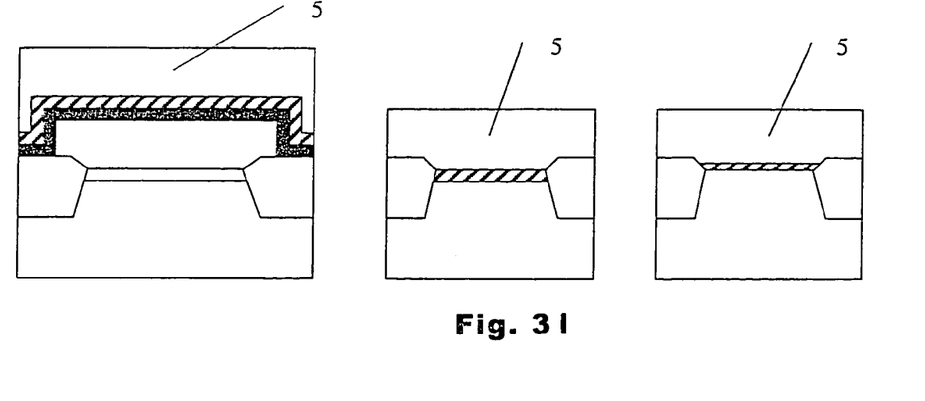

After that, a polysilicon layer is deposited so as to have a thickness of approximately 100 nm for the second electrode material which becomes the control gates of the flash memory. Furthermore, regions of the control gates are defined by means of lithography and this electrode material is patterned by means of dry etching so as to obtain a second polysilicon electrode 5 (FIG. 3I). Such an electrode becomes a gate electrode of a MOSFET in the peripheral circuit region.

Furthermore, after the formation of source/drain region of the memory cells and of the peripheral circuit MOSFETs, the first interlayer insulating film is formed, so that contact holes are formed by means of photolithography and anisotropic dry etching. After that, the semiconductor substrate 1 is annealed in a hydrogen radical atmosphere at 300 to 500° C. However, this annealing treatment may be provided during any of the steps following the formation of the above-described radical nitride film formation to the formation of the final passivation film. Furthermore, formation of wires and formation of an interlayer insulating film are repeated and the final passivation film is formed and, after that, openings for wire bonding pads are formed so as to complete the process.

Embodiment 3

Another embodiment of the present invention is shown in FIGS. 4A to 4I.

Figure 4A:
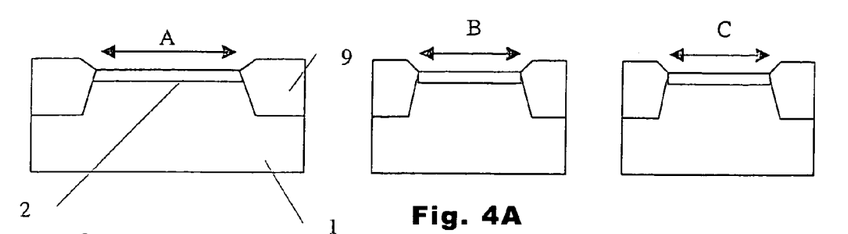
FIGS. 4A to 4I are schematic cross-sectional views showing steps for manufacturing the flash memory cell of a second embodiment semiconductor devices of the present invention.

The well and the element isolation region 9 are formed in the semiconductor substrate 1. Next, after the removal of the insulating film on the active regions, the first insulating film 2 that becomes tunnel oxide films of the non-volatile semiconductor memory device is formed so as to have a thickness of approximately 10 nm (FIG. 4A).

Figure 4B:
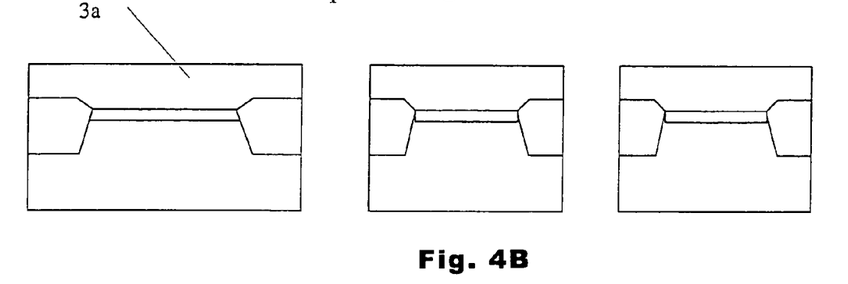

Next, the polysilicon layer 3a is deposited so as to have a thickness of approximately 100 nm as the first electrode that becomes the floating gates (FIG. 4B).

Figure 4C:
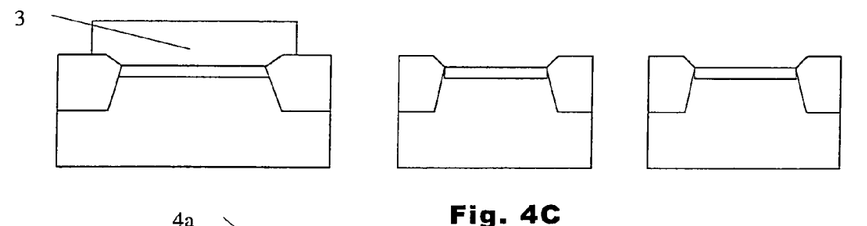

The regions of the floating gates are defined by means of lithography and, in addition, the polysilicon layer 3a is dry etched, thereby the first polysilicon electrode 3 is formed (FIG. 4C).

Figures 4D, 4E:
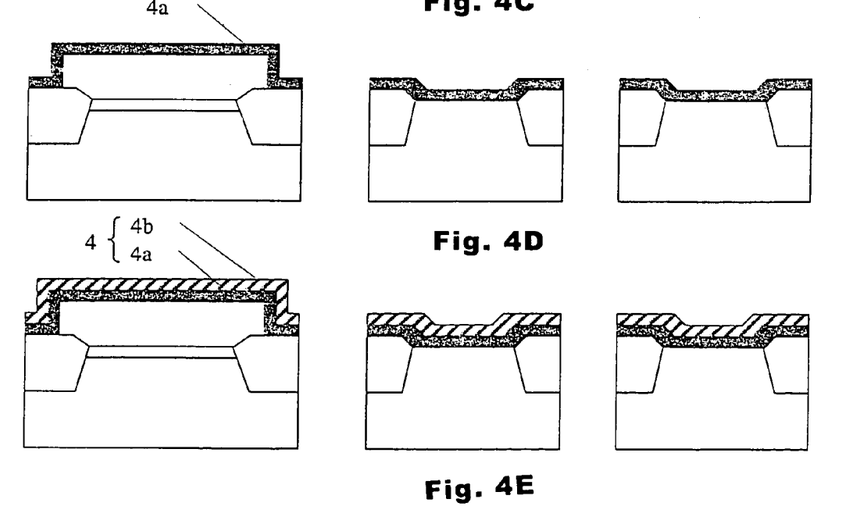

Next, after the natural oxide film on the polysilicon layer 3a in the memory cell region A and the oxide film in the active regions of the peripheral circuit device regions B and C are removed, the second insulating layer 4 is formed of the lower silicon nitride film 4a and the upper silicon nitride film 4b so as to have a thickness of approximately 3 nm (FIGS. 4D and 4E).

This lower silicon nitride film 4a is formed as follows. The vacuum container (process chamber) is vacuumed, and Kr gas, N$_2$ gas and H$_2$ gas are introduced from a shower plate into the process chamber wherein the pressure is set at approximately 100 mTorr and the temperature of the semiconductor substrate 1 is set at 500° C. Then, 2.45 GHz microwaves are transmitted into the process chamber through a radial line slot antenna and a dielectric plate from a coaxial waveguide, so that a high density plasma is generated in the process chamber and the lower silicon nitride film 4a is formed on the surface of the polysilicon. This lower silicon nitride film 4a includes Kr at an area density of $10^{10}$ cm$^{-2}$ or more.

Next, an upper silicon nitride film 4b is formed on the lower silicon nitride film 4a as follows. The inside of the process chamber is maintained at a pressure as low as 1 Torr or less, wherein the semiconductor substrate 1 is heated to 700 to 800° C. and SiClH$_2$ gas and NH$_3$ gas are introduced. These gasses make a reaction, so that Si$_3$N$_4$ is deposited on the lower silicon nitride film 4a which is the first layer so as to have a thickness of 5 to 20 nm, thereby forming the upper silicon nitride film. This is an example of a method for depositing Si$_3$N$_4$ in order to form the second layer by means of a chemical vapor reaction, and any reaction for depositing $Si_3N_4$ resulting from a reaction of a reduction gas of Si and nitrogen based gas may of course be used for the present embodiment.

Figure 4F:
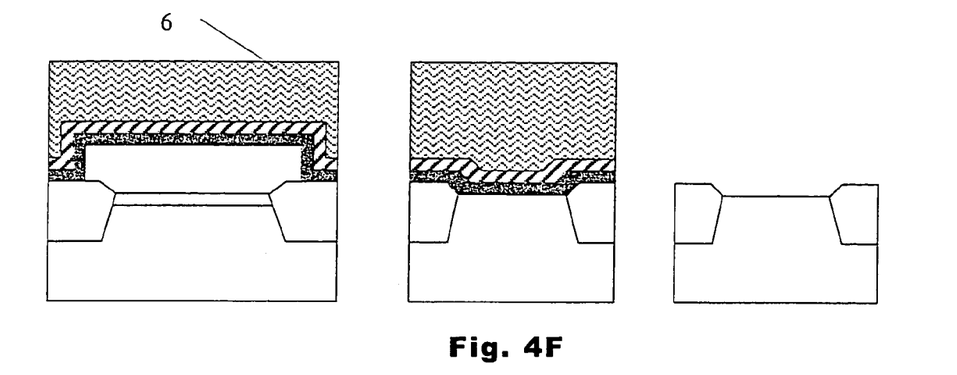
Figure 4G:
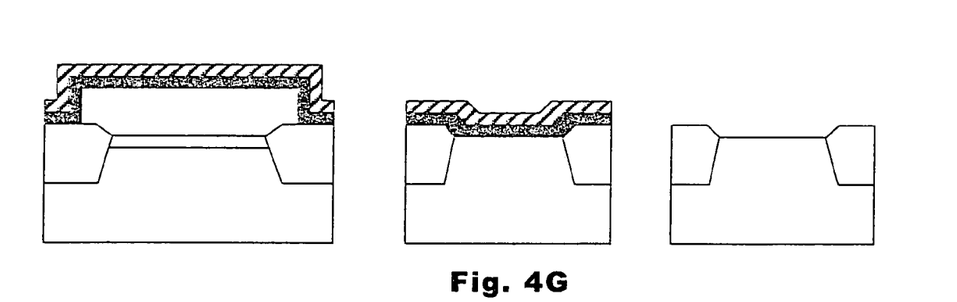
Figure 4H:
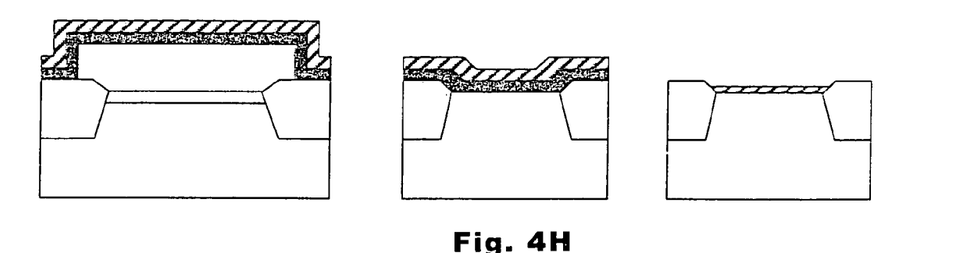

After that, the above-described silicon nitride film in the region C where low voltage driving MOSFETs of the peripheral circuit region are formed is removed using the photoresist layer 6 that has been processed by means of lithography (FIG. 4F). Furthermore, impurity ion implantation for the adjustment of the threshold voltage is carried out on the MOSFET element region for the peripheral circuit. After the removal of the photoresist layer 6 (FIG. 4G), the entirety of the substrate is again exposed to a radical nitriding atmosphere in the same manner as describe as above (FIG. 4H). That is, the vacuum container (process chamber) is vacuumed, and Kr gas, $N_2$ gas and $H_2$ gas are introduced from the shower plate into the process chamber wherein the pressure is set at approximately 100 mTorr and the temperature of the semiconductor substrate 1 is set at 500° C. Then, 2.45 GHz microwaves are transmitted into the process chamber through the radial line slot antenna and the dielectric plate from the coaxial waveguide, so that a high plasma is generated in the process chamber wherein the semiconductor substrate is exposed to this atmosphere. This annealing condition is approximately the same treatment condition that a silicon nitride film is directly formed on single crystal silicon so as to have a thickness of approximately 2 to 8 nm.

As a result, a silicon nitride film obtained by improving the second insulating film on the semiconductor substrate 1 through the exposure to a radical nitriding atmosphere is formed in the active regions of the high withstanding voltage MOSFET regions in the peripheral circuit region so as to have an equivalent thickness based on the capacitance value of an oxide film of 4 to 11.5 nm. In addition, a silicon nitride film is solely formed in the low voltage driving MOSFETs regions through the exposure to a radical nitriding atmosphere so as to have an equivalent thickness based on the capacitance value of an oxide film of 1 to 4 nm. After that, annealing may be carried out in a radical hydrogen atmosphere.

Figure 4I:
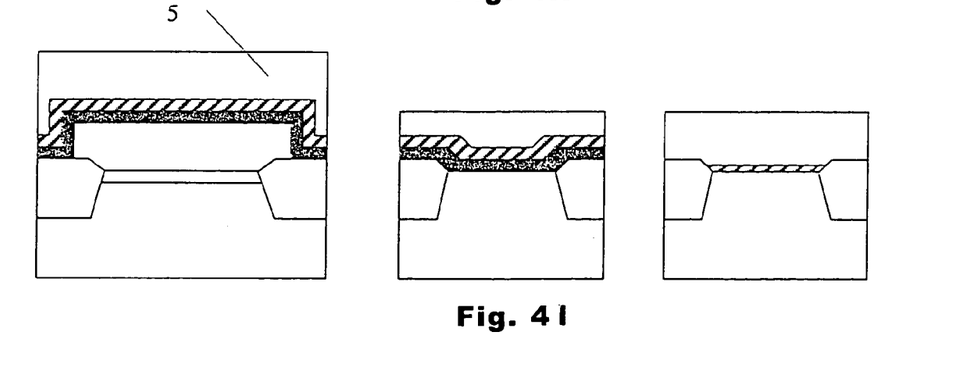

After that, a polysilicon layer is deposited so as to have a thickness of approximately 100 nm forming the second electrode material that becomes the control gates of the non-volatile memory device, and the regions of the control gates are defined by means of lithography such that this electrode material is patterned by means of dry etching so as to obtain the second polysilicon electrode 5 (FIG. 4I). Such an electrode becomes a gate electrode of a MOSFET in the peripheral circuit region.

Furthermore, after the formation of source/drain regions of the memory cells and of the peripheral circuit MOSFETs, although not shown in the cross sectional views, the first interlayer insulating film is formed and, then, contact holes are formed by means of photolithography and anisotropic dry etching. After that, the semiconductor substrate 1 is annealed in a hydrogen radical atmosphere at 300 to 500° C. However, this annealing treatment may be provided during any of the steps following the above-described formation of a radical nitride film to the formation of the final passivation film. Furthermore, formation of wires and formation of an interlayer insulating film are repeated and, after the formation of the final passivation film, openings are formed for wire bonding pads, thereby the process is completed.

According to the present invention, it becomes possible to obtain a high quality, high performance, non-volatile semiconductor memory device having excellent charge storage characteristics allowing rewriting at a low voltage, wherein an insulating film between a first electrode (floating gate) and a second electrode (control gate) is formed of at least two layers of: a lower silicon nitride film on the first electrode side obtained by nitriding the first electrode; and an upper silicon nitride film formed on the lower silicon nitride film according to a chemical vapor deposition method, and at least a part of the lower silicon nitride film contains rare gas atoms at an area density of $10^{10}$ cm$^{-2}$ or more.

What is claimed is:

1. A non-volatile semiconductor memory device comprising at least:
   a first electrode comprising silicon atoms;
   a second electrode formed on the first electrode with at least an insulating film therebetween,
   wherein the insulating film is formed of at least two layers of: a lower silicon nitride film on the first electrode side obtained by nitriding the first electrode; and an upper silicon nitride film formed on and directly contacting the lower silicon nitride film according to a chemical vapor deposition method, and wherein at least a part of the lower silicon nitride film contains a rare gas element at an area density of $10^{10}$ cm$^{-2}$ or more.

2. The device according to claim 1, in which the lower silicon nitride film is a film formed on the first electrode in an atmosphere that includes a nitrogen gas or a compound gas containing nitrogen atom and a rare gas and into which microwaves are introduced.

3. The device according to claim 1, in which the rare gas element is Kr or Ar.

4. The device according to claim 2, in which the compound gas containing nitrogen atom is $NH_3$.

5. The device according to claim 1, in which the first electrode is formed on an insulating film on a silicon substrate.

6. A flash memory comprising:
   a substrate supporting a floating gate and a control gate;
   an insulating film provided between the floating gate and the control gate; and
   wherein the insulating film comprises a first layer comprising silicon nitride and a second layer comprising silicon nitride, the second layer comprising silicon nitride being located over and directly contacting the first layer comprising silicon nitride, and wherein at least part of the first layer comprising silicon nitride includes a rare gas element at an area density of $10^{10}$ cm$^{-2}$ or more.

7. The flash memory of claim 6, wherein the first layer comprising silicon nitride contains more Ar and/or Kr than does the second layer comprising silicon nitride.

8. The flash memory of claim 6, wherein the first layer comprising silicon nitride is formed via plasma deposition, and the second layer comprising silicon nitride is formed via CVD.

* * * * *